United States Patent [19]
Rosen et al.

[11] Patent Number: 5,389,875
[45] Date of Patent: Feb. 14, 1995

[54] APPARATUS FOR NON-DESTRUCTIVE TESTING OF DIELECTRIC/MAGNETIC MATERIALS

[75] Inventors: Mark D. A. Rosen, Woodbridge, Conn.; Mark A. Lizza, Oyster Bay, N.Y.

[73] Assignee: Grumman Aerospace Corporation, Bethpage, N.Y.

[21] Appl. No.: 34,344

[22] Filed: Mar. 19, 1993

[51] Int. Cl.$^6$ .............. G01N 27/72; G01R 33/00
[52] U.S. Cl. ................. 324/228; 324/226; 324/262; 324/642; 324/316; 324/317
[58] Field of Search .......... 324/309, 307, 313, 533, 324/534, 642, 326, 317, 228, 262

[56] References Cited

U.S. PATENT DOCUMENTS

| | | | |
|---|---|---|---|
| 2,597,149 | 5/1952 | Kahan | 324/250 |
| 3,371,271 | 2/1968 | Takeuchi | 324/317 |
| 3,585,494 | 6/1971 | Bozanic | 324/317 |
| 3,884,076 | 5/1975 | Studer | 324/226 |
| 4,023,412 | 5/1977 | Luke | 324/534 |
| 4,087,745 | 5/1978 | Kennedy | 324/642 |
| 4,593,248 | 6/1986 | Hyde | 324/317 |
| 4,605,893 | 8/1986 | Braslau | 324/642 |
| 4,607,521 | 8/1986 | Saito | 324/642 |
| 4,851,762 | 7/1989 | Kim | 324/642 |

Primary Examiner—Kenneth A. Wieder
Assistant Examiner—Jose M. Solis
Attorney, Agent, or Firm—Bacon & Thomas

[57] ABSTRACT

A dielectric probe, of the type in which an electromagnetic wave is reflected from a dielectric/magnetic structure and spectrum analyzed, further includes a coil for applying a magnetic field to the structure as the wave is being reflected. Information about the intrinsic electromagnetic properties, integrity and structure of the material is obtained by comparing the reflected spectra for both the magnetic field on and off conditions.

9 Claims, 4 Drawing Sheets

APPARATUS FOR NON-DESTRUCTIVE TESTING OF DIELECTRIC/MAGNETIC MATERIALS

BACKGROUND OF THE INVENTION

1. Field of the Invention

This invention relates to non-destructive test apparatus, and in particular to a probe for evaluating the intrinsic electromagnetic properties of a dielectric/magnetic structure.

2. Description of Related Art

The interaction between an electromagnetic wave and a dielectric/magnetic structure can be analyzed by reflecting the wave off of the structure and analyzing the reflected wave. A dielectric probe is essentially a conduit for directing electromagnetic waves at the surface of the dielectric/magnetic structure and directing the reflected waves to an analyzer which analyzes changes in the waveform. The analysis generally involves measurement of both phase and magnitude of the reflected wave. Because the amount of energy reflected or absorbed depends on the intrinsic electromagnetic properties of the structure, the intrinsic properties can be deduced from the magnitude and phase of the reflected wave. The physical and mathematical principles involved are well-known to those with a working knowledge of basic electromagnetic theory, and in particular of antennas which operate according to the same fundamental principles.

Conventional dielectric probes use a variety of conduits for directing the wave against the material including open-ended waveguides, open resonators, interdigital dielectrometers, and coaxial cables, all of which are capable of carrying high frequency waves such as microwaves and/or electromagnetic waves in the VHF/UHF band. As is well-known, the electric field vectors E and the magnetic field vectors H of the wave are respectively affected by the permitivity $\epsilon$ of the material and the permeability $\mu$ of material, both of which encompass a polarization component ($\epsilon'$, $\mu'$) and a loss component ($\epsilon''$, $\mu''$). The respective vector couplings change the relative magnitude of the E and H vectors, thereby changing both the overall phase and the magnitude of the wave.

Although the theory of electromagnetic wave interaction with a dielectric and/or magnetic material is in general well-known, the specific contributions of $\mu$ and $\epsilon$ are indistinguishable in the reflected wave by conventional measurement techniques, and thus one of the intrinsic properties $\epsilon$ and $\mu$ must be known in order to deduce the other.

This is not a problem in the case of a non-magnetic material because the permeability $\mu$ can be assumed to equal the free-space permeability constant. However, where magnetic effects are significant, another method of measuring $\mu$ is required. Conventional dielectric probes are incapable of measuring the intrinsic permeability of a material apart from its dielectric properties.

Knowledge about the permeability can be critical in a variety of situations. For example, the relative effects of $\mu$ and $\epsilon$ are important in evaluating the structure of relatively thin coatings because the thickness of maximum absorption or penetration is different for a non-magnetic and magnetic materials, as will be appreciated by those familiar with antennas. A purely dielectric material absorbs the greatest amount of energy at $\frac{1}{4}$ the wavelength of the incident radiation, while a magnetic material absorbs the greatest energy at $\frac{1}{2}$ the incident wavelength. Therefore, a complete analysis of any coating structure requires knowledge of $\mu$, at least qualitatively, whenever the coating has magnetic properties.

It is of course possible to use conventional magnetic, as opposed to dielectric, probes to determine the permeability of a material which is magnetic. This is generally accomplished by reading changes in magnetic flux applied to a material and directed through a magnetic core transducer where it can be read by a sense coil. However, the use of separate magnetic and dielectric probes has a number of limitations, including difficulties in implementation and especially the inability of this $\mu$ measurement technique to be used at high frequency.

SUMMARY OF THE INVENTION

An objective of the present invention is therefore to provide an apparatus capable of analyzing not only non-magnetic structures, but also magnetic structures using an otherwise conventional probe of the type which operates by directing an electromagnetic wave at the structure and analyzing the reflected wave for changes caused by interaction between the electromagnetic wave and the structure.

It is a further objective of the invention to provide an apparatus for analyzing magnetic materials in which the effect of permeability on an electromagnetic wave can be deduced by analyzing the spectrum (amplitude and phase) of the reflected wave.

It is yet another objective of the invention to provide apparatus for analyzing both magnetic and non-magnetic structures in which the thickness of the material and other structural properties of the material can be deduced from an analysis of a wave reflected from the structure upon comparing the reflected spectrum to a standard.

Finally, it is still another objective of the invention to provide a dielectric probe with the capability of analyzing the intrinsic magnetic as well as the intrinsic electrical properties of a dielectric/magnetic material, and yet which is simple in structure and easy to manufacture.

These objectives are accomplished by providing a dielectric probe in which the conduit for directing electromagnetic waves at the material and guiding reflected waves back to an analyzer includes a magnetic flux generator, for example an electromagnetic coil wrapped around the conduit and which may be selectively energized to turn on and off the flux, the reflected wave spectra being compared under both the on and off conditions.

In an especially advantageous embodiment of the invention, the flux from the coil is concentrated and applied to the structure being analyzed via a tube of soft magnetic material surrounding the outer conductor of the coaxial cable and a soft magnetic inner conductor of the coaxial cable to concentrate the flux on the area to which the wave is directed.

As a result, the reflected wave frequency spectrum can be used to extract a wealth of information about both the intrinsic electrical and magnetic properties of the material, as well as its structure, including information concerning thickness, homogeneity in the case of a dispersed coating material, voids in the material, delaminations or gaps, and so forth.

According to yet another especially advantageous embodiment of the invention, a method of using the probe is provided which involves varying the extent and/or depth of penetration of the incident wave by varying the size of the probe and the frequency of the wave applied in order to obtain a depth profile of the structure being analyzed.

DETAILED DESCRIPTION OF THE PREFERRED EMBODIMENTS

Figure 1:
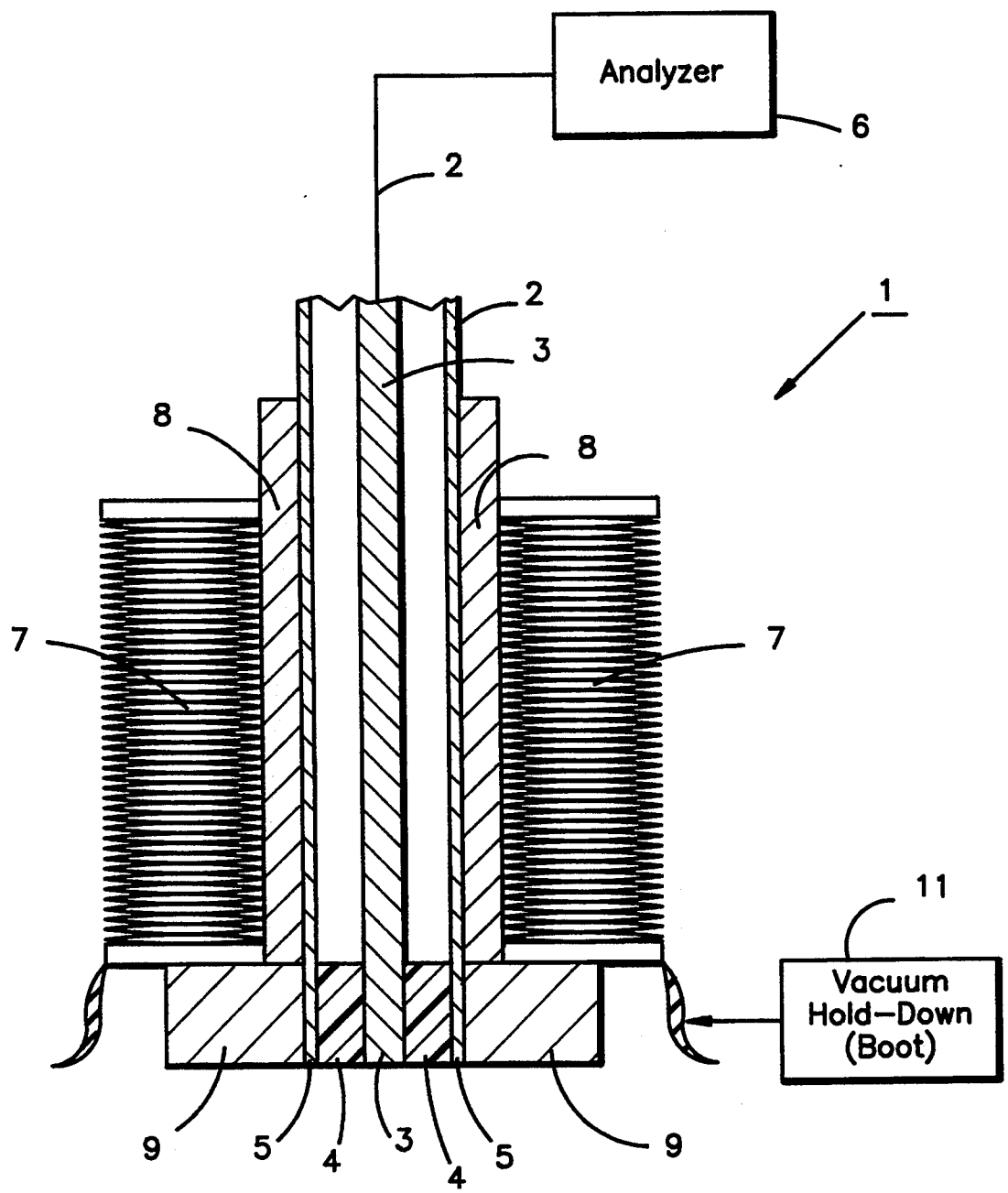
FIG. 1 is a partially schematic cross-sectional side view of a dielectric probe constructed in accordance with principles of a preferred embodiment of the invention.

FIG. 1 illustrates a currently preferred embodiment of a dielectric probe 1 constructed in accordance with the principles of the invention, including a coaxial cable 2 which includes an inner conductor 3 surrounded, respectively, by a spacer 4 made of a dielectric material and by outer conductive member 5. Although a coaxial cable is illustrated, it will be appreciated by those skilled in the art that the function of the coaxial cable in this type of probe is simply to guide electromagnetic radiation towards the material, and to guide the reflected waves away from the material to an analyzer such as network analyzer 6 depicted schematically in FIG. 1, and thus a variety of wave guides may be substituted for the illustrated cable.

The coaxial cable itself may be of known type, the specific characteristics of the cable depending on the frequency of the wave to be directed at the material. As noted above, a variety of other conduits for the wave could also be substituted, including open-ended rectangular or circular wave guides, open resonators, and interdigital dielectrometers, but a coaxial cable is preferred because of its broad frequency range and the ability to more easily couple the applied magnetic field to the sample through the use of a permeable sleeve surrounded by a coil, as described below, and the use of an iron rod or other suitable soft magnetic material as the center conductor of the cable, also as described below.

These unique features of the invention specifically include a coil 7 which serves to apply a magnetic field to the structure being tested, and structures for concentrating that field in a controllable manner. The coil 7 is a conventional electromagnetic coil connected to a current source in order to produce a field in the material. Flux concentration initially is provided by a soft magnetic sleeve 8 of generally cylindrical shape placed between the outer conductor of the cable and the coil, the sleeve including a nonmagnetic flange 9 which supports the coil and provides a contact surface for the material. The flux concentration is further abetted by the use of a soft magnetic member or rod 3 as the inner conductor of the coaxial cable. Because the sleeve is spaced from the structure being analyzed by flange 9, while the inner conductor is intended to contact the material, flux from sleeve 8 will tend to concentrate at the tip of inner conductor 3, ensuring that the flux is directed to the location needed, which is at the point where the wave penetrates the material.

In order to ensure reproducibility of the test results, the inner conductor 3 must be held in secure contact with the material being tested. Fortunately, the simple nature of the probe permits a variety of modifications to be made for this purpose, including the use of a flexible material for flange 9, either conducting or coated with a metallic layer, to allow the probe to conform slightly to curved parts. Also, a flexible boot and vacuum system depicted schematically by box 11 may be fitted around flange 9 in order to draw the probe firmly against the part being tested. As a result, it is contemplated that a thin protective coating on the probe face to protect both the probe and the part being tested may be required.

The above structure facilitates a simple test method which involves turning a magnetic field on and off and measuring the spectrum of the reflected wave under both conditions. This method can be expanded to obtain a depth profile of the structure, utilizing the properties of dependence of the penetration of the electromagnetic wave on frequency and on the size of the probe. By varying these parameters, different depths of a coating can be evaluated and a profile made.

As a result of the coil 7 and flux concentrating members 3 and 8, the magnetic character of a material can be analyzed by altering this characteristic of the material in a controlled way through application of an external field in order to prevent the material's magnetic spins or domains from moving and interacting with the electromagnetic field vectors of the incident wave. Even when the vector interactions cannot be controlled precisely enough to make a quantitative measurement of the intrinsic permeability or permitivity, the information obtained by turning on and off the field can be used in a qualitative way where comparisons to a set of standards can be made.

Figure 2:
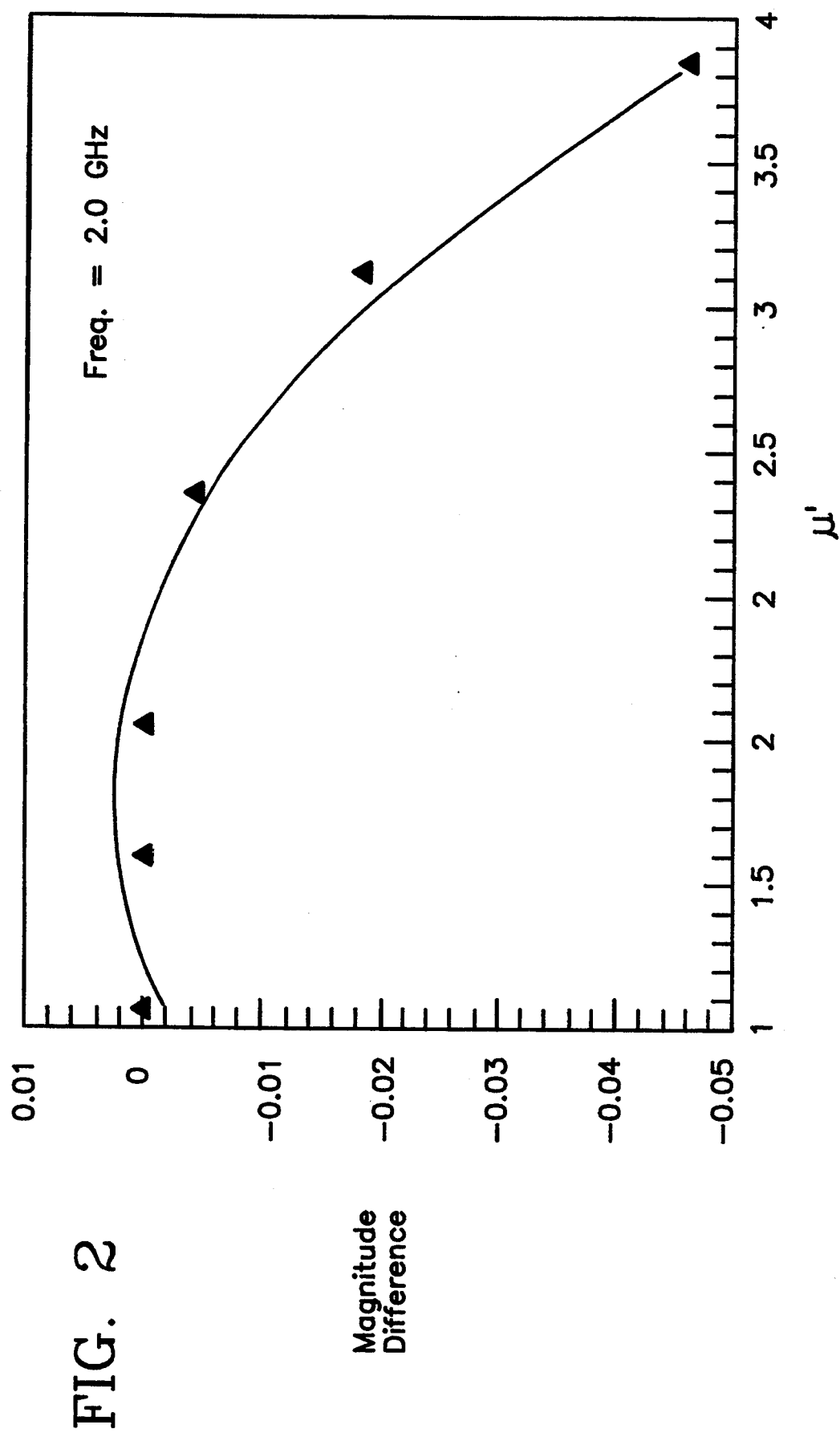
FIG. 2 is a graph of the amplitude difference between waves reflected by the probe of FIG. 1 under field and no-field conditions as a function of the magnetic permeability of a magnetic composite material.
Figure 3A:
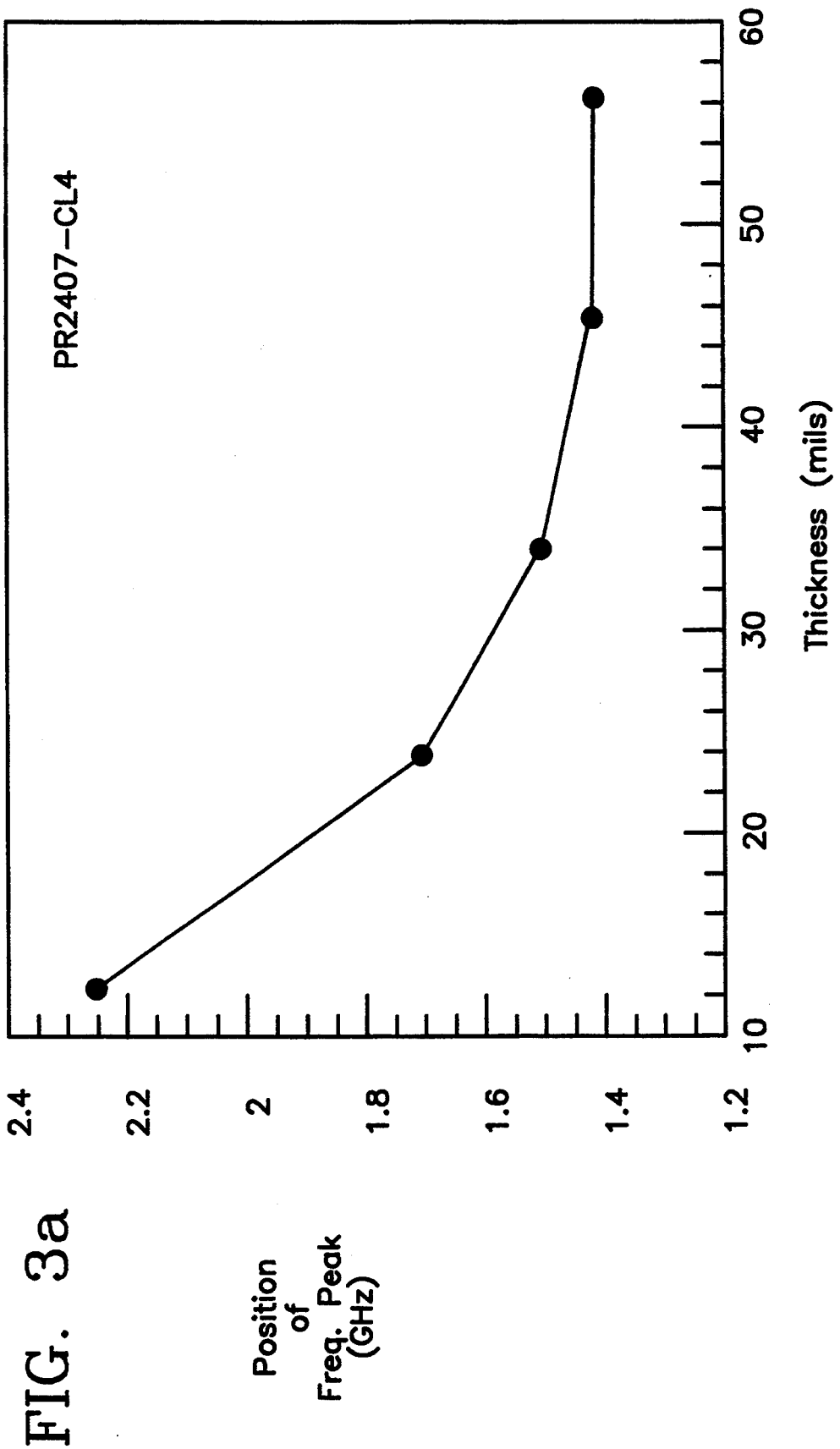
FIGS. 3a and 3b are graphs of the phase differences between waves reflected by the probe of FIG. 1 as a function of the frequency of the applied electromagnetic wave and frequency position of a particular feature for different sample thicknesses.

The graph shown in FIG. 2 is obtained by plotting a measured amplitude difference of the reflective wave under field and no-field conditions relative to the known permeability of a magnetic composite material. As is apparent from this graph, the amplitude difference is measurably sensitive to the permeability. FIG. 3a illustrates the manner in which the phase difference is dependent on thickness of the sample. The positions of the low frequency peaks in each of the curves of FIG. 3a are plotted in FIG. 3b, which shows that the positions of the peaks are clearly correlated to the thickness being measured.

Figure 3B:
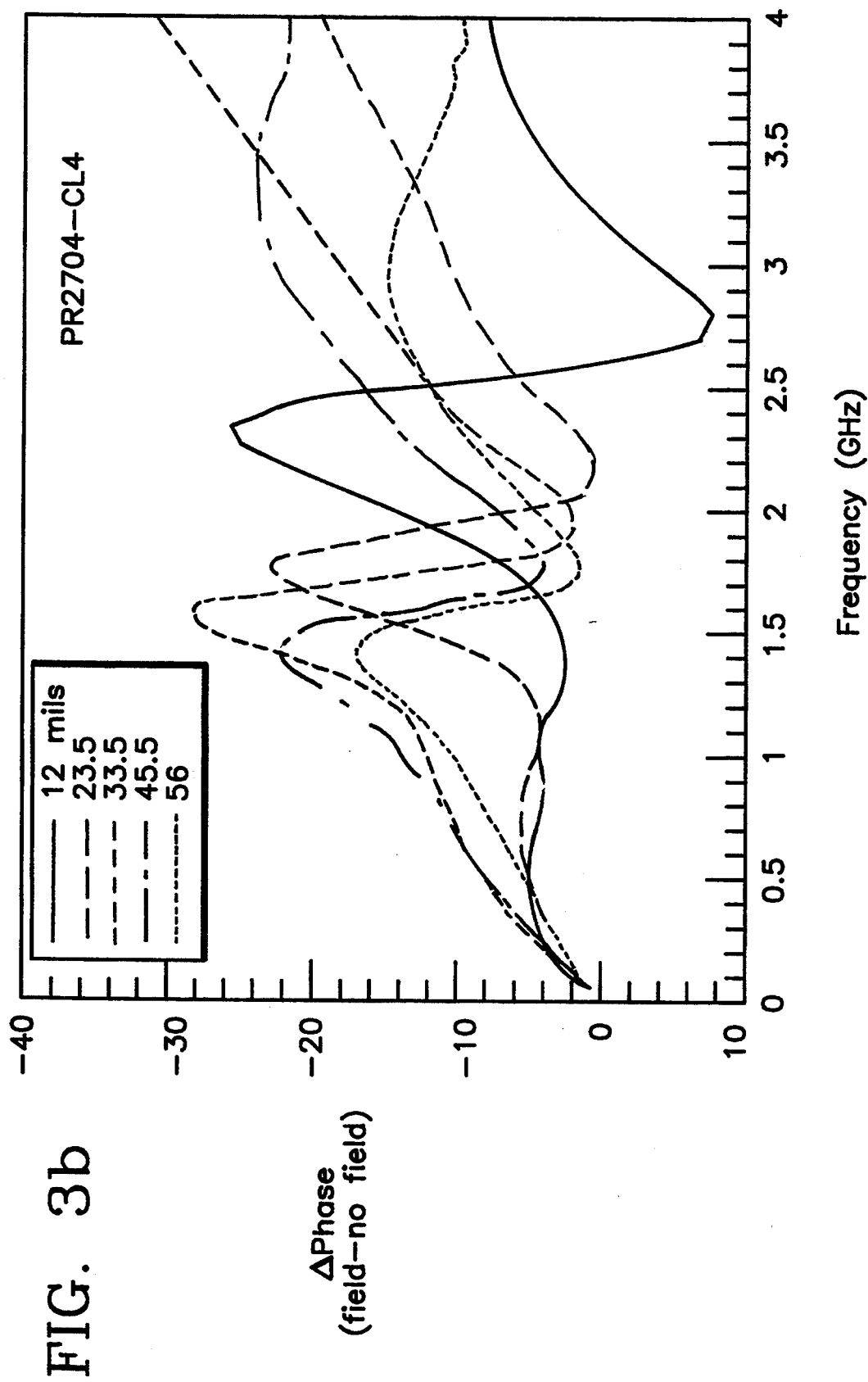

The exemplary probe used to take the measurements shown in FIGS. 2, 3a, and 3b includes a precision 7 mm. coaxial line surrounded by an electromagnetic coil containing 1820 turns, the coil generating a 2.2 KG field at the probe tip upon connection to a current of 1 ampere. The materials of the flux concentrators in this example are, respectively, 1006 stainless steel for the sleeve and pure iron for the center conductor rod. These materials and dimensions may of course be varied by those skilled in the art and are not critical to the invention. In fact, the type of wave guide, the type of flux concentrators, and even the means for applying the axial magnetic field can all be varied within the scope of the invention. Consequently, it is intended that the invention not be limited by the above description, but rather that it be defined solely by the appended claims.

What is claimed is:

1. A non-destructive test apparatus, comprising:

means for directing an electromagnetic wave at a structure to cause the wave to reflect from the structure and for guiding the reflection of the wave to an analyzer; and means for selectively applying a magnetic field to the structure simultaneously with the reflection of the electromagnetic wave from the structure in order to analyze intrinsic electromagnetic properties of the structure, wherein said electromagnetic wave directing means is a coaxial cable, said magnetic field applying means comprises a coil wrapped around an outer conductor of said cable, said magnetic field applying means further comprises means for concentrating magnetic flux on said structure, and wherein said flux concentrating means comprises a soft magnetic sleeve surrounding said outer conductor and in turn surrounded by said coil.

2. Apparatus as claimed in claim 1, wherein said sleeve is made of 1006 stainless steel.

3. Apparatus as claimed in claim 1, wherein said flux concentrating means further comprises a soft magnetic member which forms the inner conductor of said cable at an end of said cable so as to contact said structure.

4. Apparatus as claimed in claim 3, wherein said sleeve is spaced from said structure so as to concentrate flux initially induced in said sleeve by said coil into said inner conductor.

5. Apparatus as claimed in claim 3, wherein said inner conductor is made of iron.

6. Apparatus as claimed in claim 1, wherein said flux concentrating means comprises a soft magnetic inner conductor at an end of said cable so as to contact said structure.

7. Apparatus as claimed in claim 3, wherein said sleeve is made of 1006 stainless steel.

8. Apparatus as claimed in claim 7, wherein said sleeve is spaced from said structure so as to concentrate flux initially induced in said sleeve by said coil onto said inner conductor.

9. Apparatus as claimed in claim 7, wherein said inner conductor is made of iron.

* * * * *